(12) United States Patent
Flanders

(10) Patent No.: US 6,594,059 B2
(45) Date of Patent: Jul. 15, 2003

(54) TILT MIRROR FABRY-PEROT FILTER SYSTEM, FABRICATION PROCESS THEREFOR, AND METHOD OF OPERATION THEREOF

(75) Inventor: Dale C. Flanders, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

(21) Appl. No.: 09/906,495

(22) Filed: Jul. 16, 2001

(65) Prior Publication Data

US 2003/0011864 A1 Jan. 16, 2003

(51) Int. Cl.[7] .......................... G02B 26/02; G02B 27/00
(52) U.S. Cl. ..................... 359/230; 359/224; 359/578
(58) Field of Search .............................. 359/223, 224, 359/247–248, 260, 290–292, 578–579, 584–585, 889, 846, 849, 900

(56) References Cited

U.S. PATENT DOCUMENTS

| | | | |
|---|---|---|---|
| 6,201,631 B1 | 3/2001 | Greywall | 359/245 |
| 6,275,324 B1 | 8/2001 | Sneh | 359/291 |
| 6,525,880 B2 * | 2/2003 | Flanders et al. | 359/578 |

OTHER PUBLICATIONS

Compliant MEMS Technology, Solus Micro Technologies, 5706 Corsa Avenue, Westlake Village, CA 91362, 2001 (No Month) http://www.memsolutionsinc.com/solutions/technology/index.htm.

* cited by examiner

*Primary Examiner*—James Phan
(74) *Attorney, Agent, or Firm*—J. Grant Houston

(57) ABSTRACT

A tilt mirror Fabry-Perot tunable filter comprises a frame and a first mirror structure. A tether system connects the first mirror structure to this frame. The tether system is designed to enable the tilting of the first mirror structure relative to an optical axis, in addition to translation of the first mirror structure along the optical axis. A second mirror structure is further provided to define an optical cavity in combination with the first mirror structure. At least two drive electrodes are provided for electrostatically tilting and translating the first mirror structure. The resulting MEMS Fabry-Perot tunable filter is capable for hitless tuning. It can be tuned to between bands directly, i.e., without dropping intervening bands.

11 Claims, 5 Drawing Sheets

TILT MIRROR FABRY-PEROT FILTER SYSTEM, FABRICATION PROCESS THEREFOR, AND METHOD OF OPERATION THEREOF

BACKGROUND OF THE INVENTION

Microelectromechanical system (MEMS) tip and tip/tilt mirrors are commonly implemented in optical switching systems. By changing the angle of each tilt mirror, beams emitted from one optical fiber can be routed to different output optical fibers held in an array. These MEM tilt mirrors are being deployed in small port count switches, such as two-by-two (2×2) switches and larger switching fabrics having hundreds to thousands of ports.

Another common optical component is the tunable Fabry-Perot filter. These devices comprise two or more mirrors that define an optical cavity. They function as tunable band pass filters.

In the past, bulk Fabry-Perot filters have been constructed typically using piezoelectric actuators. More recently, MEMS Fabry-Perot (FP) filters have become increasingly common.

MEMS FP filters are usually manufactured with one of two cavity configurations. The most common implementation presently appears to be, what is termed, a curved-flat cavity. In this implementation, one of the mirrors is substantially flat and the other is curved. The advantage of this implementation is that high finesses can be achieved even with imperfect parallelism between the mirrors. The disadvantage is, however, that in most applications, the beam launch conditions and/or cavity must be carefully designed to avoid the excitation of higher order transverse modes in the tunable filter. The other configuration for MEMS tunable filters is termed a flat—flat cavity. In this implementation, both mirrors are substantially flat. Typically, the finesse in these filters is lower due to beam walk-off because two mirrors may not be being parallel with respect to each other. To further mitigate this problem, larger beam sizes are sometimes used. The flat—flat cavities are intrinsically single mode, however.

Bulk Fabry-Perot filters have been proposed that have the capability for hitless tuning. During this operation, one of the mirrors is intentionally tilted out of parallelism with respect to the other mirror. The mirror is then translated to modulate the optical cavity. Once the mirror is tuned to the desired location, it is tilted back into parallelism with the other mirror. This functionality allows the filter to tune from one location in the spectrum directly to another location in the spectrum. Only when it is tuned back into parallelism does the cavity resonate to enable the transmission at the passband.

SUMMARY OF THE INVENTION

A number of applications for hitless Fabry-Perot filters can be identified. They can be used as tunable detectors and tunable add/drop devices. For example, a WDM signal could be directed at the Fabry-Perot filter, with the reflection from the Fabry-Perot filter being acquired either using a circulator or angle. The tunable Fabry-Perot filter could then be used to separate out individual or multiple channels in the WDM signal for transmission through the tunable filter either to a detector or to another optical fiber link. Bulk Fabry-Perot filters, however, have poor stability due to the use of piezoelectric actuators. Moreover, they are large, making them incompatible with many commercial WDM optical systems.

The present invention is directed to a Fabry-Perot tunable filter. It specifically concerns a MEMS implementation. Moreover, it has the capability for hitless tuning, being tunable between bands directly, i.e., without dropping intervening bands. This is accomplished by using tilt mirror technology, in which at least one of the mirror structures of the tunable filter has the capability of being tilted relative to the optical axis, translated to adjust the optical length of the cavity, and then tilted back into parallelism with the other mirror structure. This modulation of the mirror structure can be accomplished using electrostatic actuation. The MEMS implementation yields a very small size, while the electrostatic operation has very good long-term stability.

In general, according to one aspect, the invention features a tilt mirror tunable filter. It comprises a frame and a first mirror structure. A tether system connects the first mirror structure to this frame. The tether system is designed to enable the tilting of the first mirror structure relative to an optical axis, in addition to translation of the first mirror structure along the optical axis. A second mirror structure is further provided to define an optical cavity in combination with the first mirror structure. At least two drive electrodes are provided for electrostatically tilting and translating the first mirror structure.

In one implementation, a support, such as a handle wafer, is provided. A device layer is then formed, e.g., deposited or bonded, to the support. The frame and the tether system are fabricated in this device layer. The tether system is released from the support to suspend the first mirror structure above the support in a MEMS release process. This is accomplished through the removal of a sacrificial structure from between the device layer and the support, in one example. The sacrificial structure, in one example, can be simply an oxide layer. In a more complex implementation, it can include silicon and oxide layers.

In another implementation, the tether system and frame are manufactured using micromachining techniques in which a device layer is patterned and then lifted from the support using micromachining techniques and/or actuators such as comb drives, for example.

In the preferred embodiment, the support comprises an optical port, which is formed through the support along the optical axis. This provides a device with a low insertion loss since absorption in the support is avoided. Further, according to the preferred embodiment, the mirror structures comprise thin film dielectric mirror coatings. Such coatings enable high reflectivities, such as greater than 95% to greater than 99%, with obtaining low loss. Such mirror coatings are critical to the manufacture of high performance devices.

In one implementation, both the first and second mirror structures are substantially flat. This allows the optical cavity to be easily spoiled by the tilting of one of the mirror structures.

In an alternative embodiment, however, one of the mirror structures has some curvature. The sag, however, of this mirror structure is limited, so that the mirror structures can be tilted with respect to each other adequately to spoil the cavity during tuning or other reflective state.

In general, according to another aspect, the invention features a method for hitless tuning of a MEMS tilt mirror tunable filter. This method comprises controlling electrostatic fields between at least two fixed electrodes and a first mirror structure. This mirror structure is connected to a frame by a tether system, for example. These electrostatic fields are controlled to tilt the first mirror structure relative to a second mirror structure and thereby spoil an optical cavity defined by the first mirror structure and the second mirror structure. Then, with the cavity spoiled, the electrostatic fields between the fixed electrodes and the first mirror structure are controlled to translate the mirror structure relative to an optical axis of the optical cavity. This results in a change in length of the optical cavity. Once the desired length is achieved, the electrostatic fields are then controlled to tilt the first mirror structure relative to the second mirror structure to realign the optical cavity.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
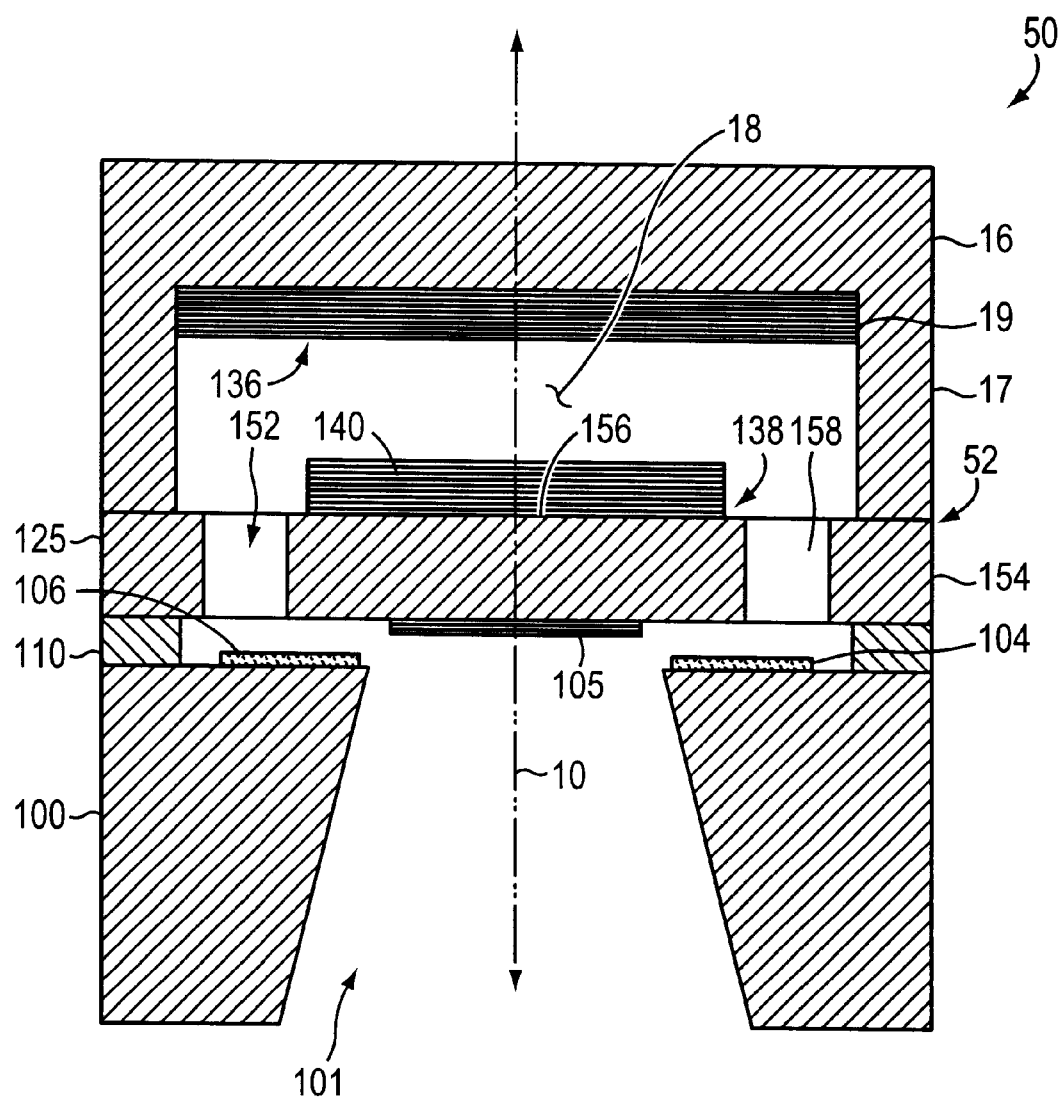
FIG. 1 is a schematic cross-sectional view of a tilt mirror MEMS Fabry-Perot tunable filter according to the present invention.

FIG. 1 shows a tilt mirror Fabry-Perot tunable filter 50, which has been constructed according to the principles of the present invention.

In the illustrated embodiment, the FP filter comprises a support 100. In the preferred embodiment, an optical port 101 is provided through the support 100, surrounding an optical axis 10 of the filter 50.

Support 100 is separated from a device layer 125 via a sacrificial structure 110. In the illustrated example, the sacrificial structure 110 defines an electrostatic cavity between the device layer 125 and the support 110. At least two discrete, fixed electrodes 104, 106 are located on the support 100, opposite the device layer 125. They are used to establish fields to the device layer 125 and thereby electrostatically actuate the tilt mirror structure 138 of the device layer 125.

The tilt mirror structure 138 comprises a body portion 156, that is connected to a surrounding frame portion 154 via tethers 158. Voids 152 are regions of the device layer 125 that have been removed to define the tethers 158.

A thin film dielectric mirror 140 is deposited on the body 156 to form a first, tilting mirror. In the preferred embodiment, the mirror 140 is fabricated from a multi-layer dielectric stack of alternating high and low index quarter-wavelength layers. Its reflectivity for some application is greater than 95% to yield a high finesse cavity. In some high performance applications, the finesse is greater than 99.5%. Preferably, an antireflective coating 105 is deposited on the external side of the body 156 to prevent reflections at the device layer/air interface.

A second, fixed mirror structure 136 is formed by depositing a second thin film dielectric mirror 19 on a base 16. Base 16 is separated from the device layer 125 via a spacer 17. In one example, the base 16 and the spacer 17 are two silicon layers separated by an etch stop insulation layer in a conventional silicon-on-insulator (SOI) structure. Specifically, spacer structure 17 is patterned and the dielectric mirror 19 then deposit on the base 16. The spacer 17 is then bonded to the device layer 125 to thereby construct the optical cavity 18. Solder bonding, other metal bonding techniques, or glass frit bonding are used in current implementations.

Figure 2A:
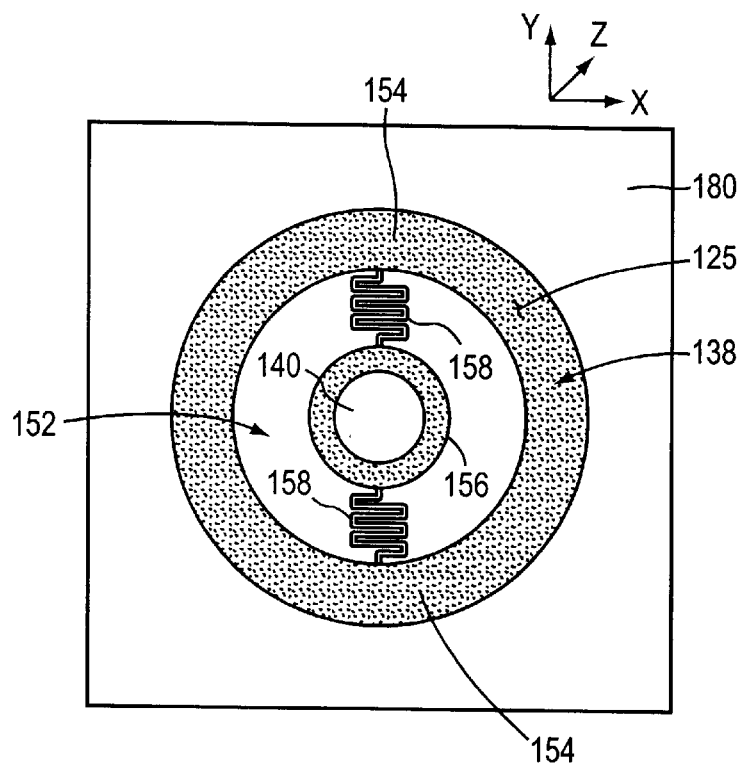
FIGS. 2A and 2B are schematic plan views tilt mirror structures of the inventive tunable filter.
Figure 2B:
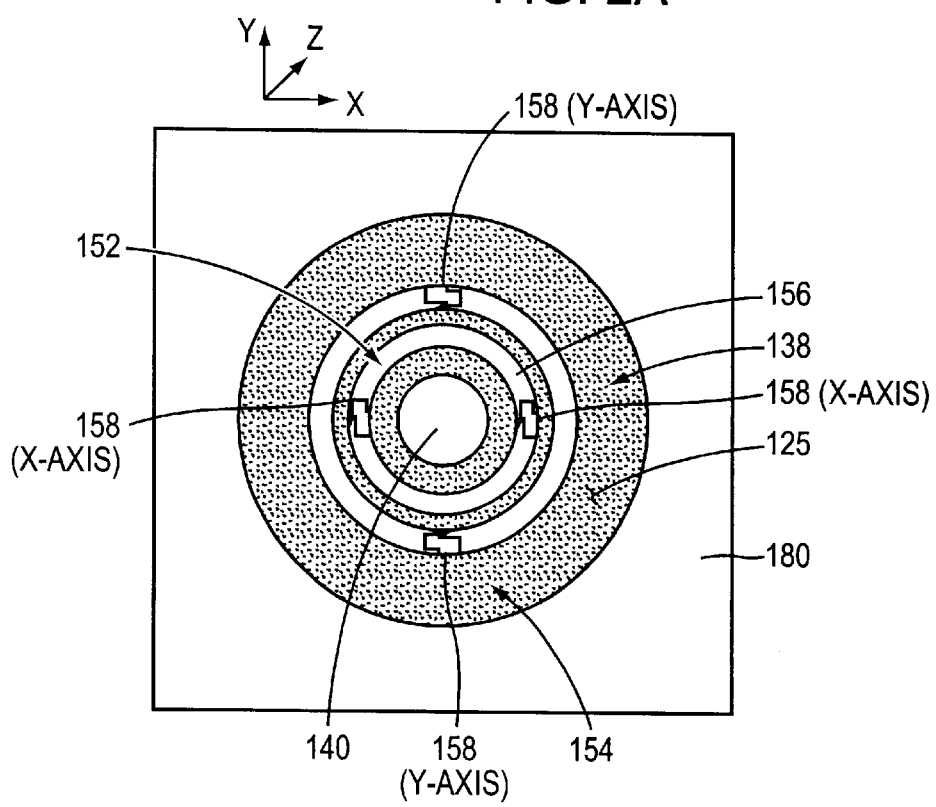

FIGS. 2A and 2B illustrate two configurations for the tilt, first mirror structure that is formed in the device layer 125.

Specifically, FIG. 2A shows a single axis tilt mirror arrangement. Specifically, two tethers 158, aligned along the y-axis, connect the body 156 to the frame 154 of the device layer 125. These tethers 158 preferably have some type of articulated shape, such as the illustrated serpentine configuration. This is important to allow the body 156 to be both tilted around the y-axis, and translated simultaneously along the z-axis.

Also shown is a metal layer 180 that is deposited on the device layer 125 to enable the bonding to the spacer 17.

FIG. 2B shows another embodiment of the tilt mirror structure 138. II this example, two sets of tethers 158 (x-axis) and 158 (y-axis) are provided in a gimbaled arrangement to enable the mirror 140 to be rotated both around the y-axis and around the x-axis, in addition to translated along the z-axis.

This tip/tilt configuration may be required in some implementations, especially if a flat—flat cavity is used and there is some initial lack of parallelism with respect to the second mirror structure 136, such as during arising fabrication since with three to four fixed electrodes on the support 100, the body 156 can be rotated around the x-axis and the y-axis to establish the cavity.

Figure 3:
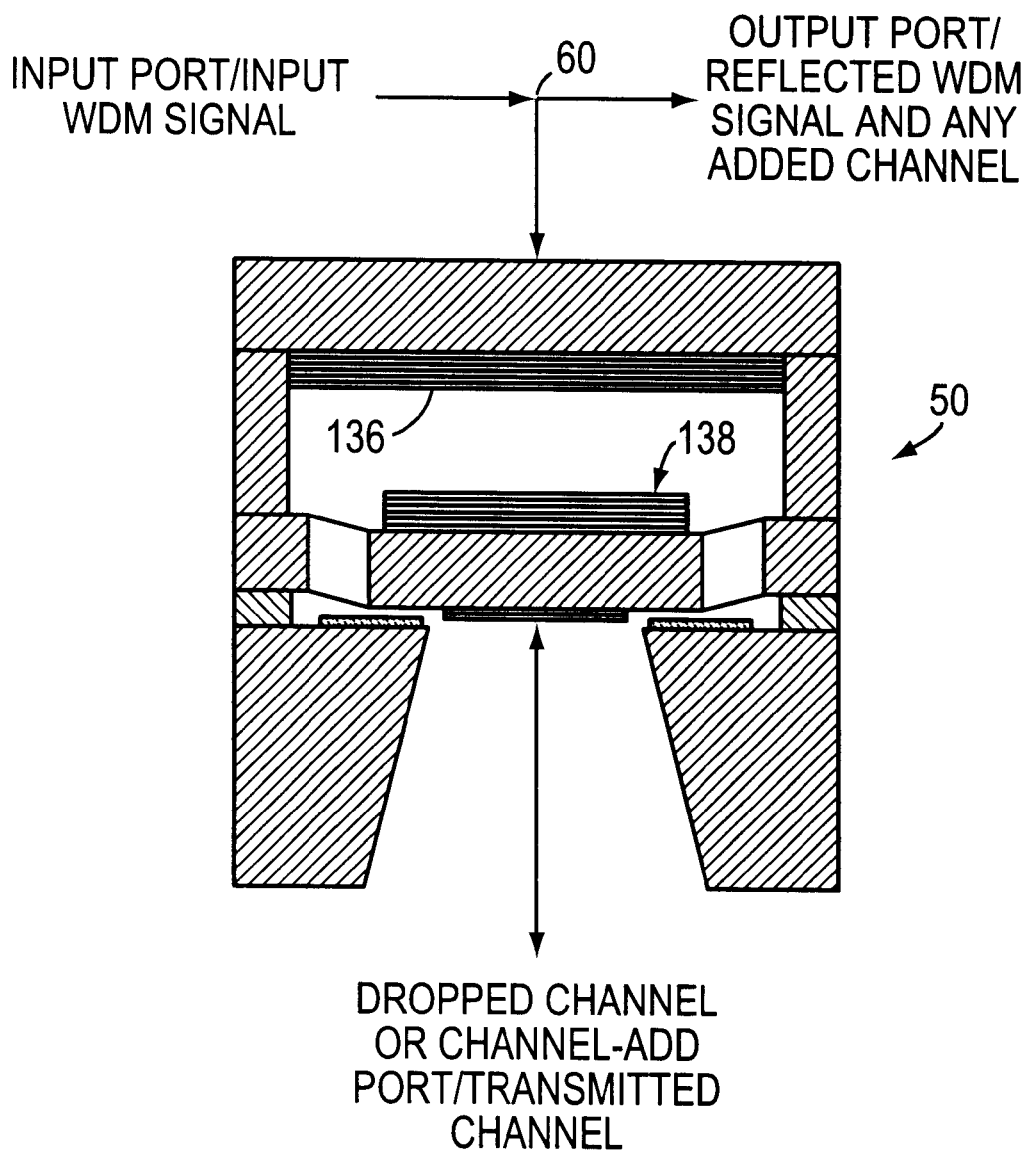
FIG. 3 is a schematic view of an optical system utilizing the inventive tip mirror Fabry-Perot filter.

FIG. 3 shows one applications of the tilt mirror Fabry-Perot filter 50. Specifically, an input WDM signal, for example, arriving at an input port is directed toward the tunable filter 50. This can be accomplished either by angle or by a discrete circulator 60.

When the first mirror structure 138 is tilted out of parallelism with the second mirror structure 136 to spoil the FP cavity, the WDM signal is entirely reflected to the output port.

When, however, the optical cavity is not spoiled and the cavity established, the channel at the tunable filter's pass band is transmitted through the tunable filter 50 to the dropped channel port and a detector, for example. The remaining channels are reflected to the output port. Additionally, a signal can be added to the WDM signal via transmission in the other direction via the channel-add port to the output port. In this way, the tunable filter can be used as a tunable add/drop device or as a tunable detector system.

Figure 4A:
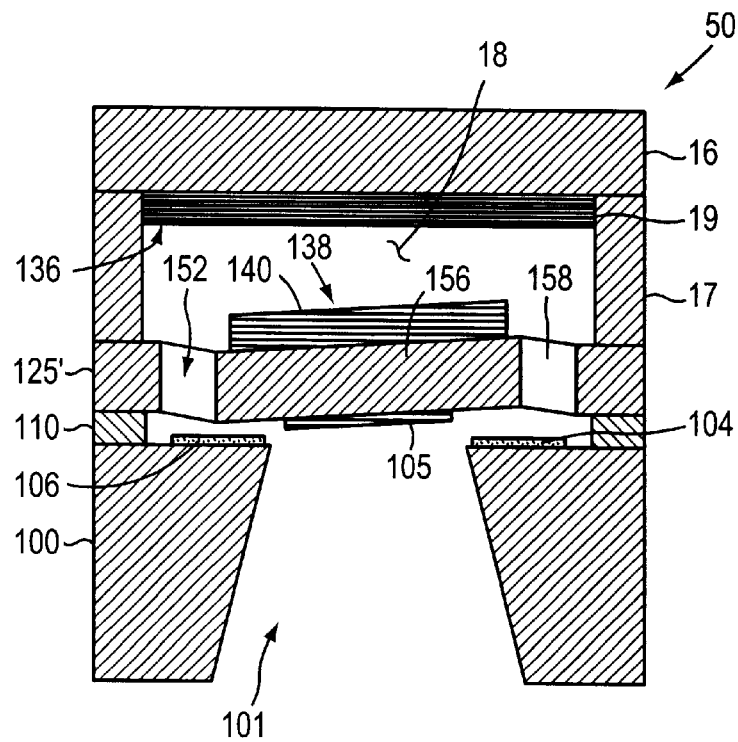
FIGS. 4A through 4C illustrate the hitless tuning of the inventive tunable filter.
Figure 4B:
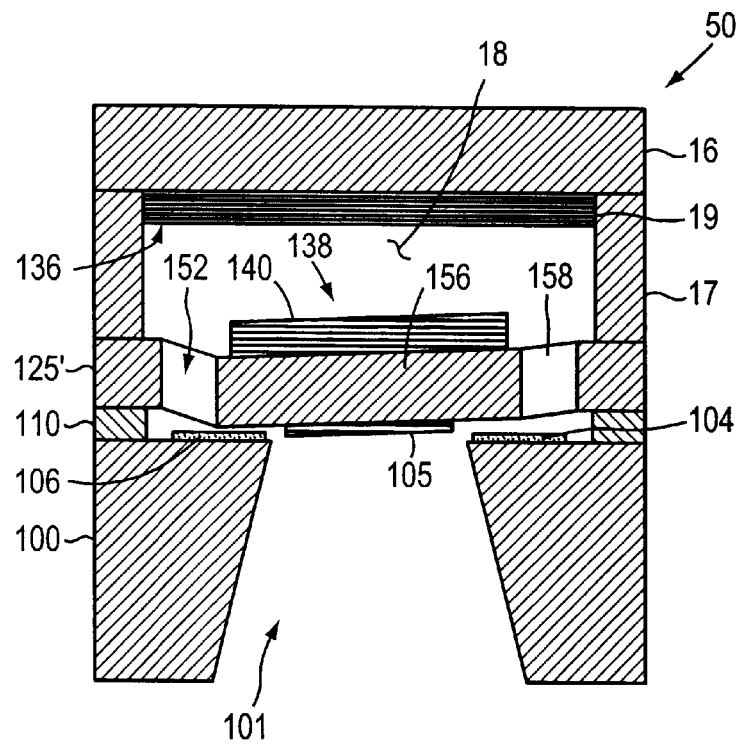
Figure 4C:
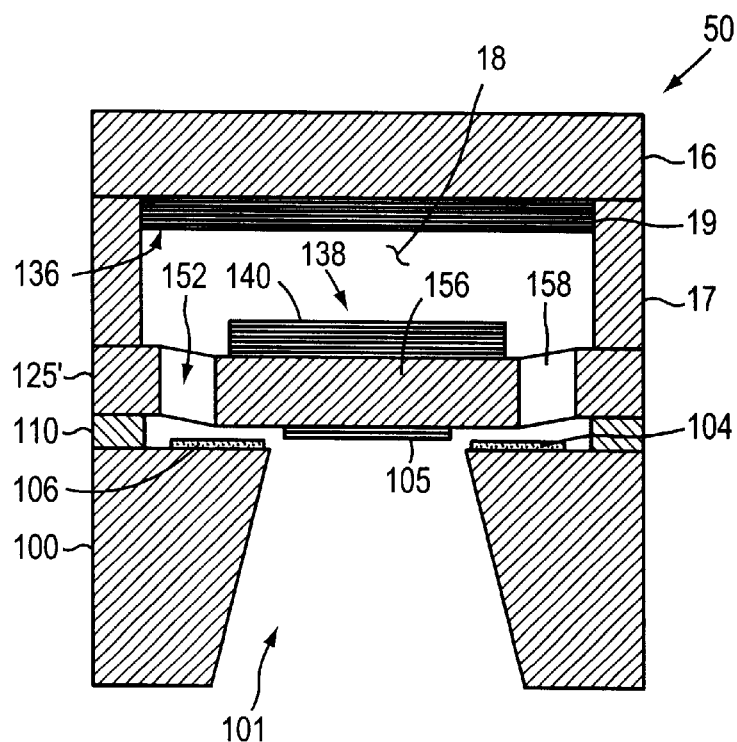

FIGS. 4A–4C illustrate the operation of the inventive system 50. Typically, when the tunable filter 50 is to be tuned in a hitless fashion, the electrostatic drive voltages between the fixed electrodes 104 and 106 and the mirror structure 138 are modulated to tilt the tilt mirror structure out of parallelism with the second mirror structure 136. In the typical implementation, this tilting is accomplished by an imbalance in the electrostatic fields between each of the fixed electrodes 104 and 106 and the first mirror structure 138. For example, in the illustrated example, electrostatic fields between fixed electrode 106 and the mirror structure 138 are higher than the electrostatic fields between the fixed electrode 104 and the mirror structure 138.

Next, as illustrated in FIG. 4B, the length of the optical cavity 18 is modulated by tuning the electrostatic fields between each of the fixed electrodes 104, 106 and the first mirror structure 138. For example, the electrostatic fields between each of the fixed electrodes 104 and 106 are increased in a tandem fashion with respect to each other based upon the typical non-linear displacement/voltage tuning curve for the device 50.

Next, as illustrated in FIG. 4C, once the desired optical length has been achieved for the optical cavity 18, the static fields between each of the fixed electrodes 104 and 106 and the first mirror structure 138 are rebalanced so that they establish the finesse of the optical cavity 18 and specifically the resonant condition.

Figure 5:
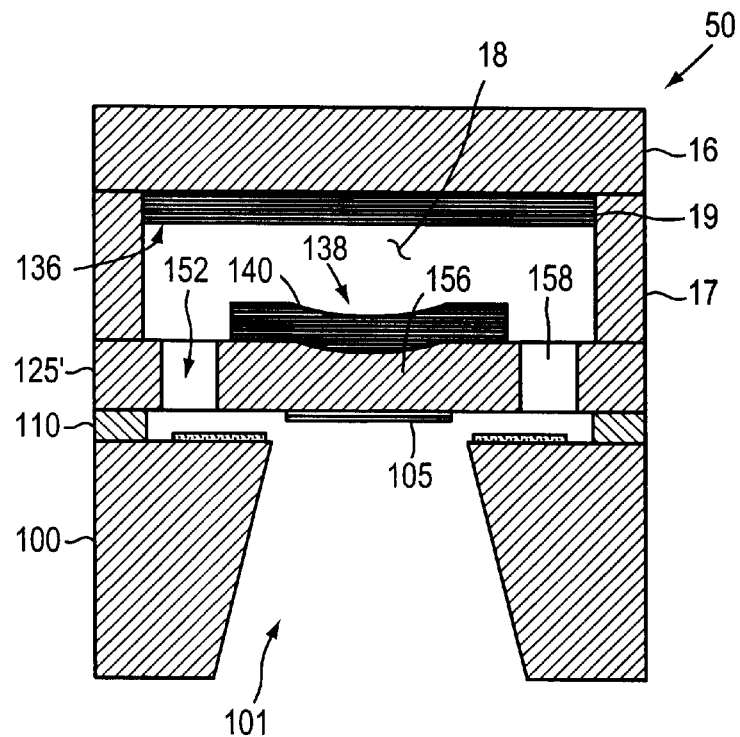
FIG. 5 shows an inventive Fabry-Perot tunable filter having a curved-flat optical cavity configuration.

FIG. 5 illustrates an alternative configuration for the mirror tunable filter. In this example, a curved-flat cavity 18 is used. Specifically, in the illustrated example, the curved reflector is located on the tilt mirror structure 138.

The advantage of this system is that threshold parallelism required between the first and second mirror structures 136, 138 to establish the finesse of the optical cavity 18 is much lower than the flat—flat cavity illustrated previously. In the transmission state, the operation of this design is much more robust. The disadvantage is, however, is that the tilt mirror structure must be tilted at a much higher angle in order to spoil the cavity.

While this invention has been particularly shown and described with references to preferred embodiments thereof, it will be understood by those skilled in the art that various changes in form and details may be made therein without departing from the scope of the invention encompassed by the appended claims.

What is claimed is:

1. A tilt mirror tunable filter, comprising:
   a frame;
   a first mirror structure;
   a tether system connecting the first mirror structure to the frame, the tether system enabling tilting of the first minor structure relative to an optical axis and translation of the first minor structure along the optical axis;
   a second mirror structure defining an optical cavity in combination with the first mirror structure;
   a support to which the frame is connected; and
   at least two drive electrodes on the support and separated from the first mirror structure in a direction of the optical axis for electrostatically tilting and translating the first mirror structure.

2. A tilt mirror tunable filter as claimed in claim 1, further comprising a device layer on the support, wherein the frame and the tether system are fabricated in the device layer, the tether system being released from the support to suspend the first mirror structure above the support.

3. A tilt mirror tunable filter as claimed in claim 2, wherein the tether system is released from the support by removal of a sacrificial structure.

4. A tilt mirror tunable filter as claimed in claim 3, wherein the sacrificial structure comprises silicon and silicon oxide sacrificial layers.

5. A tilt mirror tunable filter as claimed in claim 2, wherein the support comprises an optical port that is formed though the support along an optical axis of the filter.

6. A tilt mirror tunable filter as claimed in claim 1, wherein the first and second mirror structures comprise thin film dielectric mirror coatings.

7. A tilt mirror tunable filter as claimed in claim 1, wherein at least one of the first mirror structure and the second mirror structure comprises a curved mirror.

8. A tilt mirror tunable filter, comprising:
   a frame;
   a first minor structure;
   a tether system connecting the first mirror structure to the frame, the tether system enabling tilting of the first mirror structure relative to an optical axis and transplanting of the first mirror structure along the optical axis;
   a second mirror structure defining an optical cavity in combination with the first minor structure; and
   at least two drive electrodes for electrostatically tilting and translating the first mirror structure;
   wherein the first mirror structure comprises a thin film dielectric mirror coating and a body portion, which connects the tether system to the mirror coating.

9. A tilt mirror tunable filter, comprising:
   a frame;
   a first mirror structure;
   a tether system connecting the first mirror structure to the frame, the tether system enabling tilting of the first minor structure relative to an optical axis and translation of the first mirror structure along the optical axis;
   a second mirror structure defining an optical cavity in combination with the first mirror structure; and
   at least two drive electrodes for electrostatically tilting and translating the first mirror structure
   wherein at least one of the first mirror structure and the second mirror structure comprises a curved mirror and wherein a sag of the curved mirror enables spoiling of to optical cavity in response to tilting of the first mirror structure.

10. A method for hitless tuning of a MEMS tilt mirror tunable filter, the method comprising:
    controlling electrostatic fields between at least two fixed electrodes and a first minor structure to tilt the first mirror structure relative to a second minor structure and spoil an optical cavity defined by the first mirror structure and the second mirror structure;
    controlling the electrostatic fields between the fixed electrodes and the lint mirror structure to translate the minor structure relative to an optical axis of the optical cavity thereby changing a length of the optical cavity, and
    controlling the electrostatic fields between the fixed electrodes and the first mirror structure to tilt the first minor structure relative to the second minor structure and realign the optical cavity.

11. A method as claimed in claim 10, wherein the first mirror structure is connected to the frame via a tether system.

* * * * *